(12) United States Patent
Chen et al.

(10) Patent No.: US 9,647,087 B2
(45) Date of Patent: May 9, 2017

(54) DOPED PROTECTION LAYER FOR CONTACT FORMATION

(71) Applicant: TAIWAN SEMICONDUCTOR MANUFACTURING CO., LTD., Hsin-Chu (TW)

(72) Inventors: Mei-Chun Chen, Zhudong Township (TW); Ching-Chen Hao, Zhubei (TW); Wen-Hsin Chan, Zhubei (TW); Chao-Jui Wang, Zhudong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/843,720

(22) Filed: Sep. 2, 2015

(65) Prior Publication Data

US 2015/0380516 A1   Dec. 31, 2015

Related U.S. Application Data

(62) Division of application No. 13/910,610, filed on Jun. 5, 2013, now Pat. No. 9,136,340.

(51) Int. Cl.
*H01L 21/00* (2006.01)
*H01L 29/66* (2006.01)
(Continued)

(52) U.S. Cl.
CPC .... *H01L 29/6659* (2013.01); *H01L 21/28123* (2013.01); *H01L 21/28247* (2013.01); *H01L 21/31111* (2013.01); *H01L 21/31155* (2013.01); *H01L 21/76802* (2013.01); *H01L 21/76825* (2013.01); *H01L 21/76834* (2013.01); *H01L 21/76877* (2013.01); *H01L 21/76895* (2013.01); *H01L 21/76897* (2013.01); *H01L 23/485* (2013.01); *H01L 29/408* (2013.01); *H01L 29/665* (2013.01); *H01L 29/7833* (2013.01); *H01L 29/7843* (2013.01); *H01L 29/518* (2013.01); *H01L 2221/1063* (2013.01); *H01L 2924/0002* (2013.01)

(58) Field of Classification Search
CPC ......... H01L 21/02063; H01L 21/76805; H01L 21/823475; H01L 23/28
USPC .................. 438/98, 230, 231, 232, 233, 256
See application file for complete search history.

(56) References Cited

U.S. PATENT DOCUMENTS 5,660,681 A   8/1997 Fukuda et al.
5,831,305 A   11/1998 Kim
(Continued)

*Primary Examiner* — Tan N Tran
(74) *Attorney, Agent, or Firm* — Birch, Stewart, Kolasch & Birch, LLP

(57) ABSTRACT

A method for forming a semiconductor device is provided. The method includes providing a semiconductor substrate with a gate stack formed on the semiconductor substrate. The method also includes forming a protection layer doped with a quadrivalent element to cover a first doped region formed in the semiconductor substrate and adjacent to the gate stack. The method further includes forming a main spacer layer on a sidewall of the gate stack to cover the protection layer and forming an insulating layer over the protection layer. In addition, the method includes forming an opening in the insulating layer to expose a second doped region formed in the semiconductor substrate and forming one contact in the opening.

20 Claims, 8 Drawing Sheets

(51) Int. Cl.
*H01L 29/40* (2006.01)
*H01L 21/28* (2006.01)
*H01L 29/78* (2006.01)
*H01L 21/768* (2006.01)
*H01L 23/485* (2006.01)
*H01L 21/311* (2006.01)
*H01L 21/3115* (2006.01)
*H01L 29/51* (2006.01)

(56) References Cited

U.S. PATENT DOCUMENTS

| | | | |
|---|---|---|---|
| 6,018,180 A | 1/2000 | Cheek et al. | |
| 6,040,222 A * | 3/2000 | Hsu | H01L 21/82341 |
| | | | 257/E21.437 |
| 6,180,472 B1 * | 1/2001 | Akamatsu | H01L 21/76897 |
| | | | 257/E21.438 |
| 7,227,230 B2 * | 6/2007 | Gambino | H01L 21/31155 |
| | | | 257/369 |
| 8,592,271 B2 * | 11/2013 | Tsai | H01L 21/82380 |
| | | | 257/374 |
| 2005/0032321 A1 | 2/2005 | Huang et al. | |
| 2006/0216882 A1 | 9/2006 | Chen et al. | |

* cited by examiner

DOPED PROTECTION LAYER FOR CONTACT FORMATION

CROSS REFERENCE

This application is a Divisional of U.S. application Ser. No. 13/910,610, filed on Jun. 5, 2013 and entitled "Doped protection layer for contact formation".

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs.

For example, contacts are typically vertical interconnect structures formed in an integrated circuit that connect the diffusion regions and/or gate electrodes of a semiconductor device to an interconnect layer. Individual semiconductor devices formed in a semiconductor substrate are usually electrically coupled to each other through contacts in order to form functional integrated circuits. Forming contacts to electrically connect semiconductor elements with smaller and smaller sizes in the semiconductor substrate is getting more difficult.

Thus, it is desired to have a technology that is improved, to form reliable contact structures in a semiconductor device.

BRIEF DESCRIPTION OF THE DRAWINGS

For a more complete understanding of the embodiments, and the advantages thereof, reference is now made to the following descriptions taken in conjunction with the accompany drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

Figure 1A:
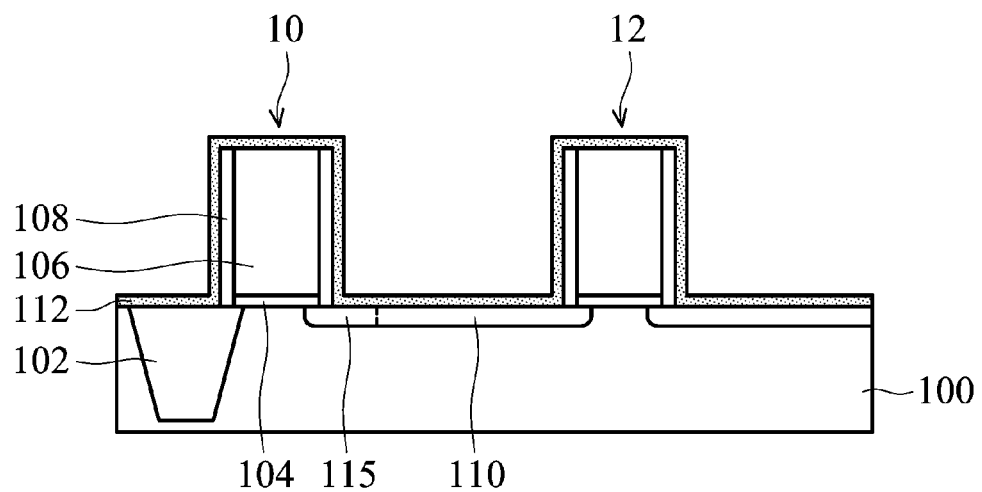
FIGS. 1A-1I are cross sectional views showing a process sequence for forming a semiconductor device, in accordance with some embodiments.

FIGS. 1A-1I are cross sectional views showing a process sequence for forming a semiconductor device, in accordance with some embodiments. As shown in FIG. 1A, a semiconductor substrate 100 is provided. The semiconductor substrate 100 may be a semiconductor wafer (such as a silicon wafer) or a portion of a semiconductor wafer. In some embodiments, the semiconductor substrate 100 includes an elementary semiconductor material including silicon or germanium in a single crystal, polycrystal, or amorphous structure. In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, and/or combinations thereof. The semiconductor substrate 100 may also include multi-layer semiconductors, semiconductor on insulator (SOI) (such as silicon on insulator or germanium on insulator), and/or combinations thereof.

An isolation structure 102 may be optionally formed in the semiconductor substrate 100 to define various active regions in the semiconductor substrate 100, and to electrically isolate neighboring devices (e.g. transistors) from one another. The isolation structure 102 may be formed by using an isolation technology, such as (but is not limited to) local oxidation of semiconductor (LOCOS), shallow trench isolation (STI), or the like. The isolation structure 102 may include a silicon oxide, silicon nitride, silicon oxynitride, fluoride-doped silicate glass (FSG), a low-K dielectric material, other suitable materials, and/or combinations thereof. In some embodiments, the formation of the isolation structure 102 includes patterning the semiconductor substrate 100 by a photolithography process, etching a trench in the semiconductor substrate 100 (for example, by using a dry etching, wet etching, plasma etching process, and/or combinations thereof), and filling the trench (for example, by using a chemical vapor deposition process) with a dielectric material. In some embodiment, the filled trench may have a multi-layer structure, such as a thermal oxide liner layer filled with silicon nitride or silicon oxide.

As shown in FIG. 1A, gate stacks, such as the gate stacks 10 and 12, are formed on the semiconductor substrate 100. In some embodiments, a gate insulating layer 104 is formed on the semiconductor substrate 100. The gate insulating layer 104 may be made of silicon oxide, silicon oxynitride, a high dielectric constant material (high-k material), and/or combinations thereof. The high dielectric constant material may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The gate insulating layer 104 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof. Then, a gate electrode layer 106, such as a polysilicon layer, is formed on the gate insulating layer 104, for example, by using a CVD process or other suitable processes.

The gate insulating layer 104 and the gate electrode layer 106 are then patterned, for example, by using a photolithography process and an etching process such that gate stacks including the gate stacks 10 and 12 are formed.

In some embodiments, a sealing layer 108 is formed on sidewalls of the gate stacks 10 and 12. However, the sealing layer 108 is optional. The sealing layer 108 is made of a dielectric material. The dielectric material may include, for example, a silicon nitride, silicon oxide, silicon oxynitride, other suitable materials, and/or combinations thereof. The sealing layer 108 is deposited on the surfaces of the gate stacks 10 and 12 and the semiconductor substrate 100 by using a suitable process, such as a CVD process. Then, an etching process, such as a dry etching process, is performed to partially remove the sealing layer 108 such that the sealing layer 108 remains on the opposite sidewalls of the gate stacks 10 and 12. The sealing layer 108 may protect the gate stacks 10 and 12 from damage when subsequent process steps are performed.

Next, a doped region 110 is formed in the semiconductor substrate 100. For example, there is an ion implantation process performed to form the doped region 110 on opposite sides of the gate stacks 10 and 12 and in the semiconductor substrate 100. In some embodiments, a doped region 115 which is a portion of the doped region 110 near the gate stack 10 and underneath the sealing layer 108 serves as a lightly-doped source/drain region (LDD region). Thus, reference number 115 is also used to designate the LDD region. In some embodiments, the implantation process is performed at a tilt angle such that the formed LDD region 115 extends under the gate stacks 10 and 12.

As shown in FIG. 1A, a protection layer 112 is formed on the gate stacks 10 and 12 and the semiconductor substrate 100. The protection layer 112 is made of a dielectric material. In some embodiments, the protection layer 112 is a silicon oxide layer. However, another dielectric layer, such as an oxynitride layer (e.g. a silicon oxynitride layer), may also be used. The protection layer 112 is formed by using any suitable process, such as chemical vapor deposition (CVD), atomic layer deposition (ALD), plasma enhanced CVD (PECVD), remote plasma CVD (RPCVD), physical vapor deposition (PVD), other suitable processes, and/or combinations thereof. In some embodiments, the protection layer 112 is conformally formed on the semiconductor substrate 100 and the gate stacks 10 and 12.

In some embodiments, the thickness of the protection layer 112 is in a range from about 10 Å to about 40 Å. In some other embodiments, the thickness of the protection layer 112 is in a range from about 10 Å to about 20 Å. However, it should be appreciated that embodiments of the disclosure are not limited thereto. In other embodiments, the protection layer 112 has a thickness that is different from those mentioned above. In some embodiments, the protection layer 112 has a thickness similar to that of a native oxide layer. The thickness of the protection layer 112 should not be too thick because the protection layer 112 might be hard to remove. On the other hand, the protection layer 112 should also not be too thin because the implanted ions in a subsequent implantation processes might penetrate through the protection layer 112.

Figure 1B:
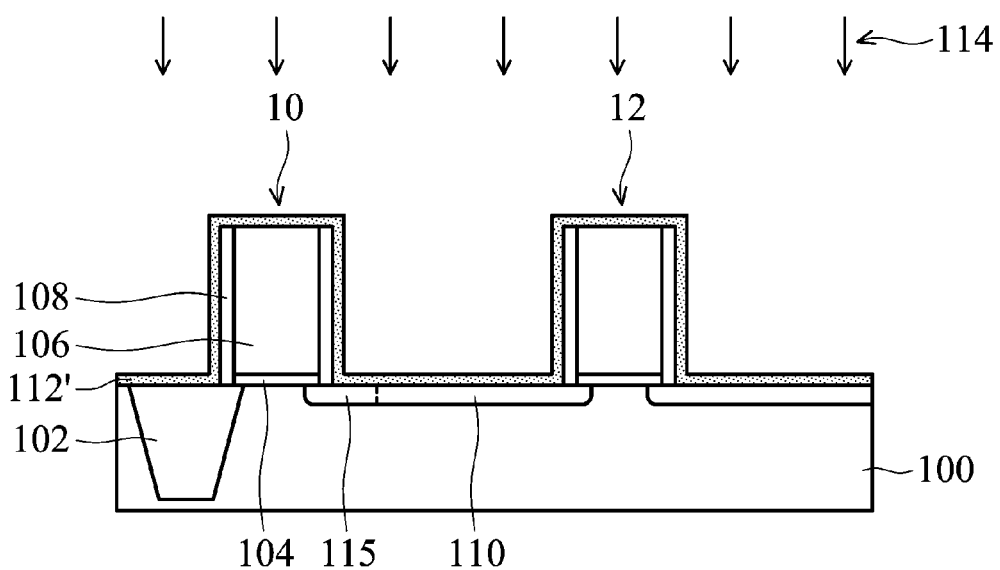

Next, as shown in FIG. 1B, a doping process 114 is performed to dope the protection layer 112 with one or more quadrivalent element to form a doped protection layer 112' to reduce the etching rate of the doped protection layer 112' when it is exposed to an oxide etching chemistry. In other words, it is harder to etch the doped protection layer 112' doped with the quadrivalent element in an oxide etching process (e.g. a silicon oxide etching process), when compared to the non-doped protection layer 112 or a native oxide layer. A suitable quadrivalent element may include silicon (Si), carbon (C), germanium (Ge), the like, and/or combinations thereof.

The etching rate of the doped protection rate 112' may be tuned by tuning the concentration of the doped quadrivalent element thereof. The doped protection layer 112' with a higher concentration of the doped quadrivalent element has a lower etching rate when exposed to the oxide etching process. However, the concentration of the quadrivalent element thereof should not be too high since the etching rate might be too high or other problems might occur, which is not desirable either. In some embodiments, the concentration of the quadrivalent element doped in the protection layer 112 is in a range from about $10^8$ atoms/cm$^3$ to about $10^{16}$ atoms/cm$^3$. In some embodiments, the concentration of the quadrivalent element doped in the protection layer 112 is in a range from about $10^{10}$ atoms/cm$^3$ to about $10^{15}$ atoms/cm$^3$. In some embodiments, the concentration of the quadrivalent element doped in the protection layer 112 is in a range from about $10^6$ atoms/cm$^3$ to about $10^{14}$ atoms/cm$^3$. In some embodiments, the doped protection layer 112' is a silicon oxide layer implanted with silicon (Si). Thus, a non-stoichiometric $Si_xO_2$ layer may be formed, and x is greater than 1.

In some embodiments, the doping process 114 is performed by using an implantation process, such as an ion implantation process. The quadrivalent element is implanted with low energy such that a main portion or all of the implanted quadrivalent elements does not penetrate through the doped protection layer 112' and to the structure under the doped protection layer 112'. In some embodiments, the implanted quadrivalent element is substantially located within a surface portion of the doped protection layer 112'. In some other embodiments, a plasma implantation process is adopted to implant the doped protection layer 112' with the quadrivalent element.

In some embodiments, the implantation energy of the ion implantation process is in a range from about 0.3 KeV to about 2 KeV. In some other embodiments, the implantation energy is in a range from about 0.5 KeV to about 1 KeV. The implantation energy should be carefully chosen to prevent the implanted quadrivalent element from reaching elements under the doped protection layer 112'. The implantation energy may be adjusted according to the kind of the quadrivalent element chosen to be doped and/or the thickness of the protection layer 112.

Figure 2:
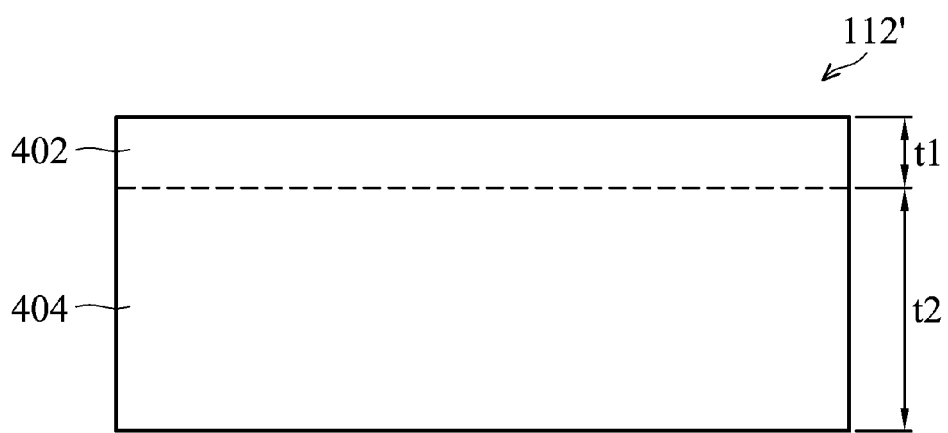
FIG. 2 is a cross sectional view showing a protection layer implanted with a quadrivalent element, in accordance with some embodiments.

FIG. 2 is a cross sectional view showing the doped protection layer 112' implanted with a quadrivalent element, in accordance with some embodiments, and like reference numerals are used to designate like elements. As shown in FIG. 2, the doped protection layer 112' includes a surface portion 402 and a lower portion 404 which have thicknesses t1 and t2, respectively. The implanted quadrivalent element is mainly or completely located in the surface portion 402. In some embodiments, the thickness t1 of the surface portion 402 is in a range from about 5 Å to about 15 Å. In some embodiments, a ratio between the thickness t1 and the total thickness of the doped protection layer 112' (i.e., t1/(t1+t2)) is in a range from about ⅛ to about ½. In some other embodiments, a ratio between the thickness t1 and the total thickness (t1/t1+t2) is in a range from about ¼ to about ⅓. However, it should be appreciated that embodiments of the disclosure are not limited thereto. In other embodiments, the implanted quadrivalent element is distributed evenly in the doped protection layer 112'. In some other embodiments, the concentration of the implanted quadrivalent element in the doped protection layer 112' gradually decreases along a direction from the surface portion 402 towards the lower portion 404.

In some embodiments, more than one kinds of quadrivalent elements are implanted into the doped protection layer 112'. For example, two or more implantation processes are adopted to implant two or more kinds of quadrivalent elements into the doped protection layer 112'. Alternatively, more than one kinds of quadrivalent elements may be implanted into the doped protection layer 112' by using a single implantation process. For example, silicon (Si) and carbon (C) or silicon (Si) and germanium (Ge) can be implanted into a silicon oxide layer in a single implantation process or separate implantation processes. In some other embodiments, a patterned mask layer (not shown) is disposed between the ion source and the protection layer 112 such that the implanted quadrivalent element is substantially only located in specific regions under the openings of the pattern mask layer.

In addition, in some embodiments, the doping process 114 is performed by using an implantation process. As shown, the main traveling direction (as indicated by the arrow shown in FIG. 1B) of the implanted ions during the ion implantation process is substantially perpendicular to a surface (e.g. a main top surface) of the semiconductor substrate 100. However, embodiments of the disclosure are not limited thereto. In some other embodiments, the implantation process of the quadrivalent element is performed at a tilt angle.

Figure 3A:
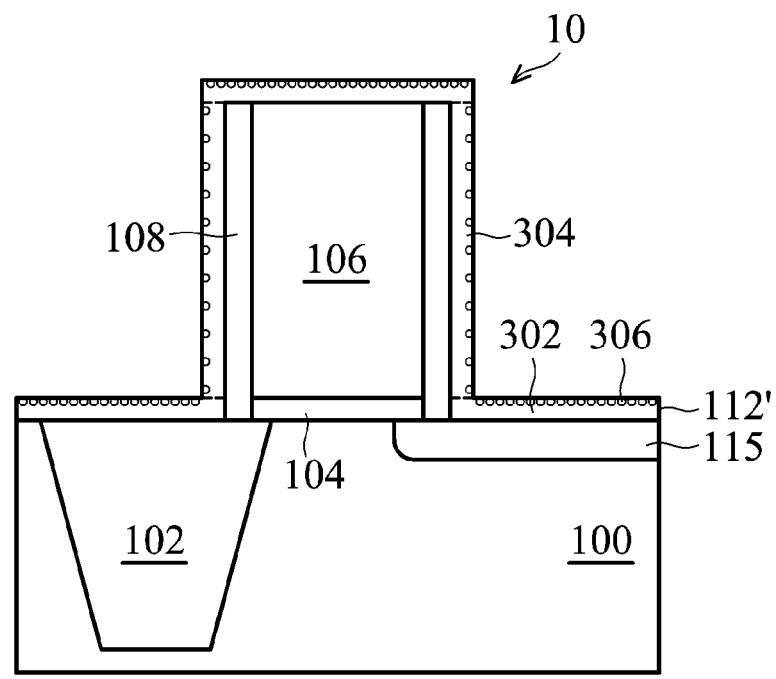
FIGS. 3A and 3B are cross sectional views each showing a protection layer of a semiconductor device, in accordance with some embodiments.
Figure 3B:
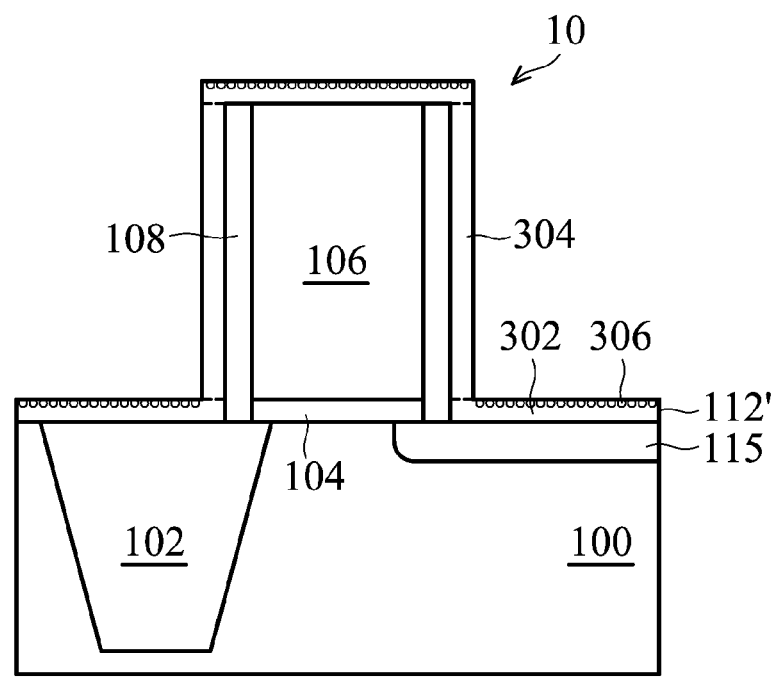

FIGS. 3A and 3B are enlarged cross sectional views each showing a portion of the structure shown in FIG. 1B, in accordance with some embodiments, and like reference numerals are used to designate like elements. As shown in FIG. 3A, the doped protection layer 112' has a portion 304 located on the sidewalls of the gate stack 10 and a portion 302 located on the semiconductor substrate 100. The circles labeled by the reference numbers "306" are used to represent the distribution of the doped quadrivalent element. As shown in FIG. 3A, the concentration of the doped quadrivalent element 306 in the portion 302 is higher than the concentration of the doped quadrivalent element 306 in the portion 304. In some other embodiments, such as that shown in FIG. 3B, the portion 304 located on the sidewalls of the gate stack 10 has substantially no extra quadrivalent element doped. The doped quadrivalent element 306 is mainly or completely located in the portion 302 and the top horizontal portion of the doped protection layer 112'. In some embodiments, the doped quadrivalent elements 306 are mainly located in a surface portion of the doped protection layer 112', similar to the structure shown in FIG. 2. The portions 302 and 304 of the doped protection layer 112' may together form an L-shape layer or an L-shape like layer. In other words, the doped protection layer 112' may have a portion located on the semiconductor substrate 100 and have another portion further extending on the sidewall of the gate stack 10.

Figure 1C:
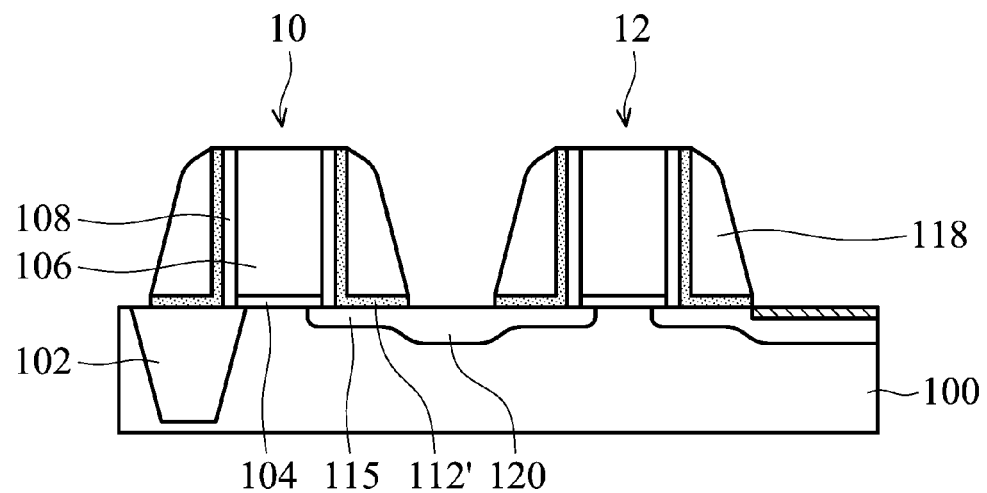

Referring to FIG. 1C, a main spacer layer 118 is then formed on sidewalls of the gate stacks 10 and 12 to cover a portion of the doped protection layer 112'. The main spacer layer 118 may be made of a dielectric layer, such as a silicon nitride layer, a silicon oxynitride layer, or combinations thereof. The main spacer layer 118 is deposited on the gate stacks 10 and 12 and the semiconductor substrate 100 by using a suitable process, such as a CVD process, and then etched by using an etching process, such as, a dry etching process, to have the structure shown in FIG. 1C.

Next, an etching process is used to remove the doped protection layer 112' not covered by the main spacer layer 118. The top horizontal portion of the doped protection layer 112' is also removed. No additional photolithography process is needed to form an additional mask. Fabrication cost and time are thus reduced. The etching process may be performed by a wet etching process, dry etching process, and/or combinations thereof. For example, a solution containing hydrogen fluoride (HF) is used to remove the doped protection layer 112' which is not covered, thus patterning the doped protection layer 112'. Alternatively, in some other embodiments, a patterned photoresist layer is formed on the doped protection layer 112', and an etching process is performed such that the doped protection layer 112' has a desired pattern.

Referring to FIGS. 1C and 2, in some embodiments, the surface portion 402 of the doped protection layer 112' is located between the main spacer layer 118 and the lower portion 404 of the doped protection layer 112'. The surface portion 402 having a higher concentration of the doped quadrivalent element is adjacent to the main spacer layer 118.

As shown in FIG. 1C, a doped region 120 is formed in the semiconductor substrate 100. For example, an ion implantation process is used to form the doped region 120 in the semiconductor substrate 100. In some embodiments, the doped region 120 is a heavily-doped source/drain region (S/D region). In some embodiments, the S/D implantation process is performed at a tilt angle. After the S/D implantation process is performed, an annealing process, such as a rapid thermal process (RTP), may be performed to repair the crystal structure of the silicon in the S/D region and activate the dopant in the S/D region.

Figure 1D:
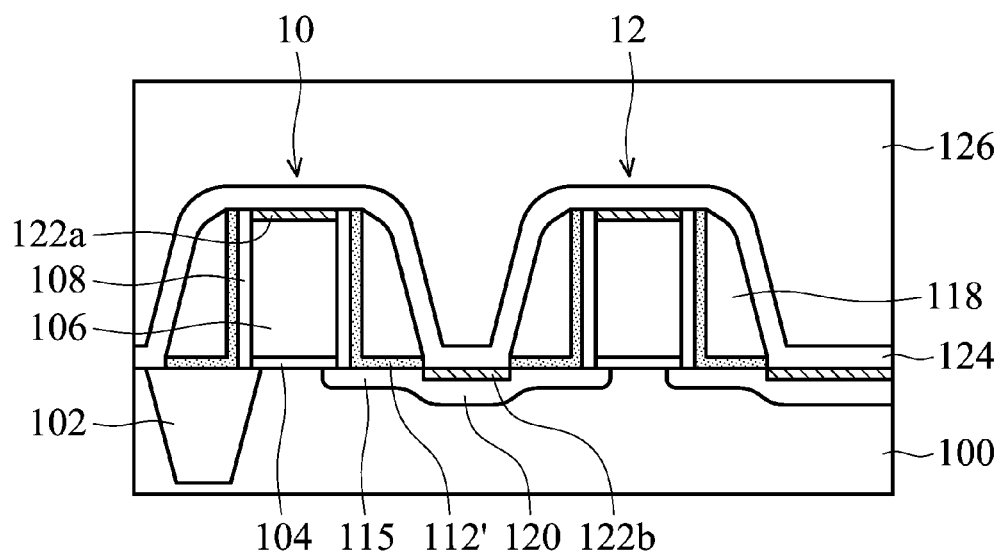

Next, as shown in FIG. 1D, a salicidation (self-aligned silicidation) process may be optionally performed to form metal silicide regions 122a and 122b on the gate electrode layer 106 and the doped region 120 (such as a S/D region), respectively. For example, a metal film is deposited on the semiconductor substrate 100 to be in direct contact with the exposed silicon surface, such as surfaces of the gate electrode layer 106 and the doped region 120 (e.g. a S/D region). Any suitable process, such as a PVD process, CVD process, plating process, electroless plating process, and/or the like, may be performed to form the metal film. A heating operation is then carried out to cause a reaction between the deposited metal film and the exposed silicon surface, thus forming the metal silicide regions 122a and 122b, respectively. The un-reacted portion of the deposited metal film is then removed, for example, by using an etching process. The silicide regions 122a and 122b may protrude from the original surface of the exposed silicon surface. The silicide regions 122a and 122b have lower resistance than non-silicided regions, especially in smaller geometries.

The material of the deposited metal film may include nickel. Thus, a nickel silicide region including $Ni_2Si$, $NiSi_2$, NiSi, and/or combinations thereof may be formed. Other suitable metal materials may also be used to form the metal silicide regions, such as cobalt (Co), nickel (Ni), platinum (Pt), titanium (Ti), ytterbium (Yb), molybdenum (Mo), erbium (Er), and/or combinations thereof. The metal silicide region 122b may be construed as a portion of the doped region 120, such as an S/D region, and the metal silicide region 122a may be construed as a portion of the gate electrode layer 106.

As shown in FIG. 1D, a contact etch stop layer 124 is then optionally formed on the semiconductor substrate 100, the main spacer layer 118, and the metal silicide regions 122a and 122b. The contact etch stop layer 124 may include a silicon nitride layer. The thickness of the contact etch stop layer 124 may be in a range from about 150 Å to about 400 Å. The contact etch stop layer 124 may be conformally deposited on the semiconductor substrate 100. The contact etch stop layer 124 may be formed by using a suitable process, such as a CVD process. In some embodiments, the contact etch stop layer 124 also serves as a stressor layer, which may increase the carrier mobility in a channel region in the semiconductor substrate 100, thus improving the operation of a semiconductor device formed thereby.

Then, an insulating layer 126 is formed on the semiconductor substrate 100 and the gate stacks 10 and 12 by any suitable processes, such as a CVD process, HDPCVD process, spin-on process, sputtering process, and/or combinations thereof. The insulating layer 126 may include any suitable material, such as a silicon oxide, silicon oxynitride, borosilicate glass (BSG), phosphoric silicate glass (PSG), borophosphosilicate glass (BPSG), fluorinated silicate glass (FSG), low-k material, porous dielectric material, and/or combinations thereof. A planarization process, such as a chemical mechanical polishing (CMP) or the like, may then be adopted, so that the insulating layer 126 may have a substantially planar surface to facilitate subsequent process steps.

Figure 1E:
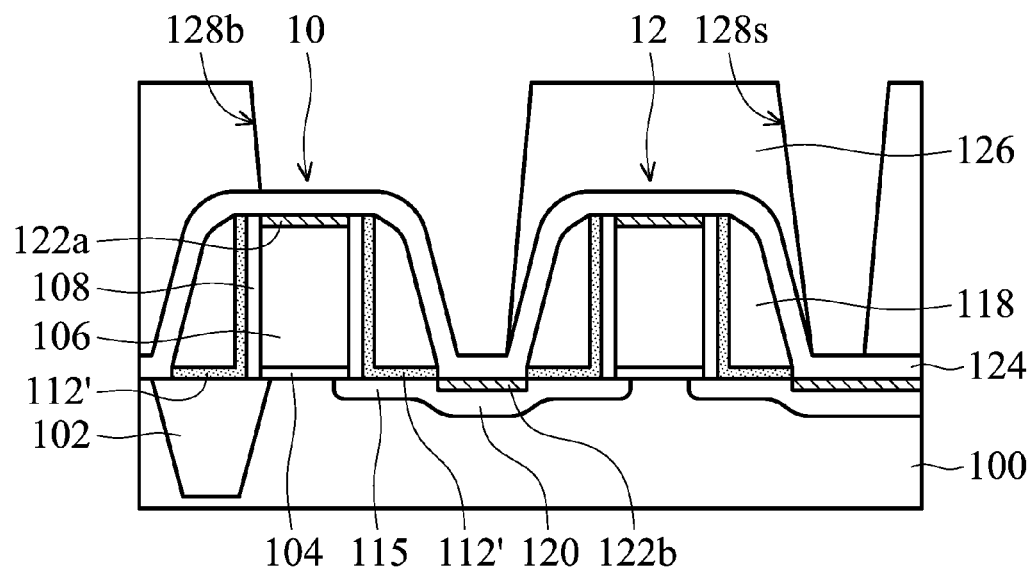

As shown in FIG. 1E, a patterning process including, for example, a photolithography process and an etching process is then performed to partially remove the insulating layer 126 to form openings, which include, for example, the openings 128b and 128s. In some embodiments, the opening 128b is formed for forming a butted contact of an SRAM device. The shapes of the openings observed from a top view may include a square, rectangle, circle, ellipse, or the like. The shapes of the openings 128b and 128s may be different from each other. In some embodiments, the openings 128b and 128s extend from the substantially planar surface of the insulating layer 126 to the surface of the previously formed contact etch stop layer 124. The etchant used to etch the insulating layer 126 substantially does not etch the contact etch stop layer 124 or may etch the contact etch stop layer 126 at a very small rate.

Figure 1F:
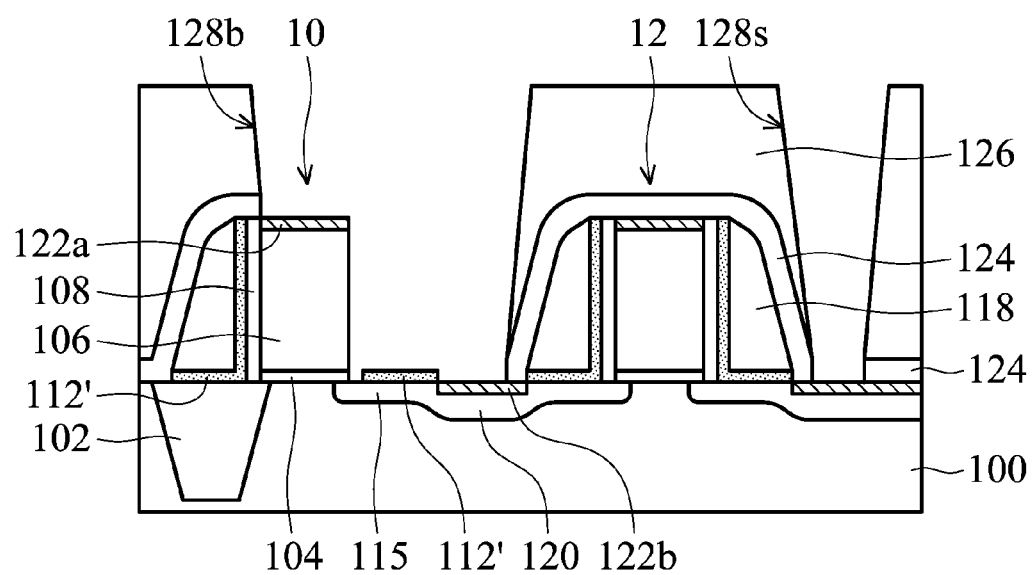

Next, as shown in FIG. 1F, the contact etch stop layer 124 in the openings 128b and 128s is removed such that the metal silicide regions 122a and 122b are exposed. In some embodiments, the main spacer layer 118, the vertical portion of the doped protection layer 112' which is on the sidewall of the gate stack 10, and the sealing layer 108 in the opening 128 are also removed together with the contact etch stop layer 124. Because the vertical portion of the doped protection layer 112' is doped with a smaller amount of the quadrivalent element and has a faster etching rate (compared to the doped protection layer 112' on the LDD region 115), the vertical portion of the doped protection layer 112' may also be removed together with the contact etch stop layer 124 and the main spacer layer 118. In some other embodiments, some of the main spacer layer 118, the vertical portion of the doped protection layer 112', and/or the sealing layer 108 in the opening 128 are partially left to remain in the opening 128.

Figure 1G:
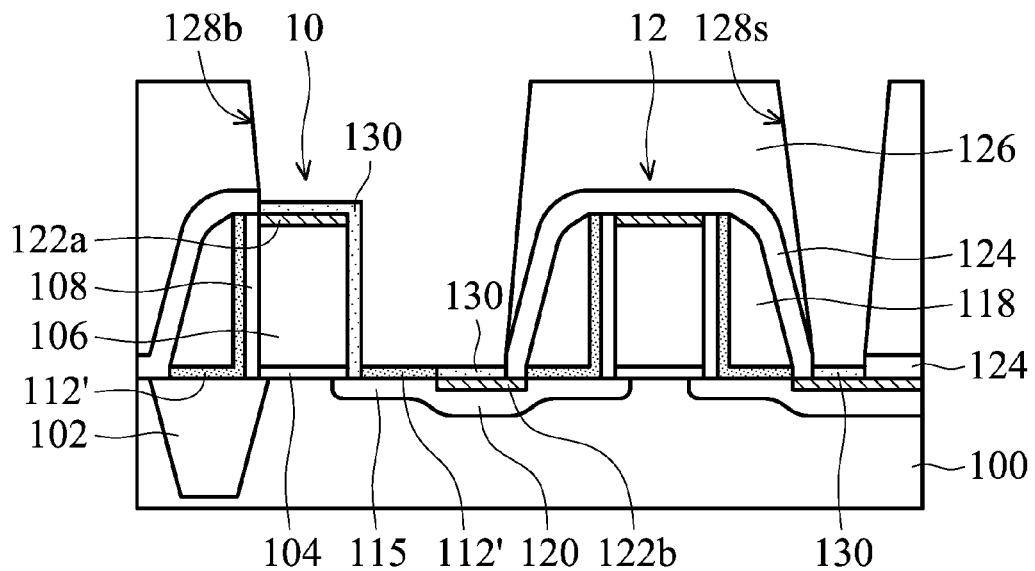

As shown in FIG. 1G, after the contact etch stop layer 124 in the openings 128b and 128s is removed to expose the gate stack 10 and the doped region 120, a native oxide layer 130 is grown on the exposed surfaces of the gate stack 10, the doped region 120, and/or the metal silicide region 122b. The native oxide layer 130 may be grown once the gate stack 10 and the doped region 120 are exposed after the overlying contact etch stop layer 124 is removed. In some embodiments, the native oxide layer 130 is a silicon oxide layer. The thickness of the grown native oxide layer 130 may be in a range from about 10 Å to about 40 Å which is in the same thickness range of the doped protection layer 112'. However, in other embodiments, the thickness of the native oxide layer 130 is different from the range mentioned above.

Figure 1H:
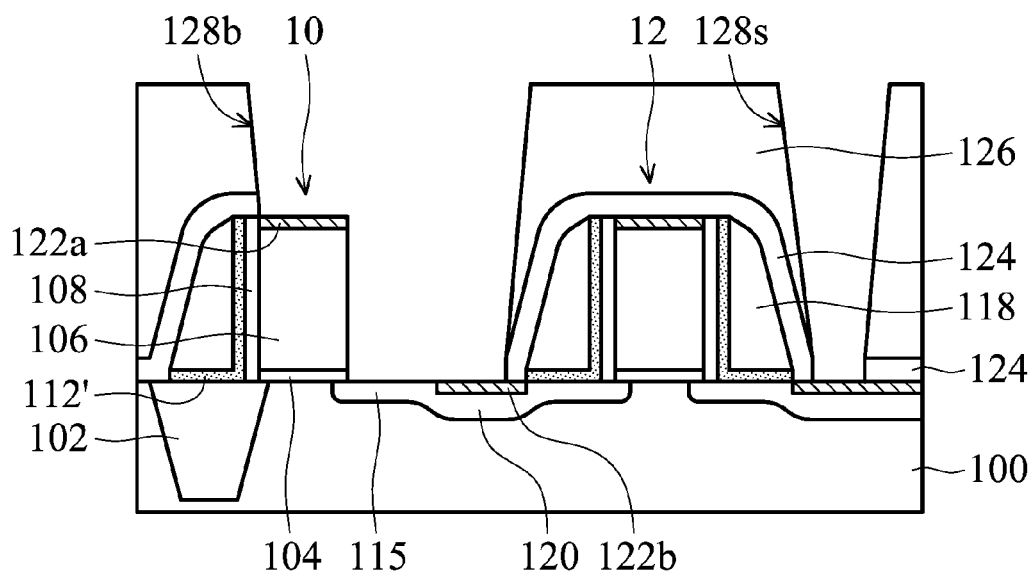

Next, as shown in FIG. 1H, an etching process, such as a dry etching or an HF dipping, is performed to remove the exposed native oxide layer 130 (including the native oxide layer 130 on the gate stack 10, the doped region 120, and the bottom of the opening 128s) and the exposed doped protection layer 112' to expose the doped region 120 (such as an S/D region and/or the metal silicide region 122b on the S/D region). After the etching process is performed, the LDD region 115 is also exposed. The metal silicide region 122a and a side surface of the gate electrode layer 106 may also be exposed. In some embodiments, it is relatively more difficult to etch the doped protection layer 112' doped with the quadrivalent element when compared to the native oxide layer 130. In the etching process, the etching rate of the native oxide layer 130 is higher than the etching rate of the doped protection layer 112'. In some embodiments, the portion of the doped protection layer 112' on the LDD region 115 is completely removed. In some other embodiments, a small portion of the doped protection layer 112' is left on the LDD region 115.

Figure 4A:
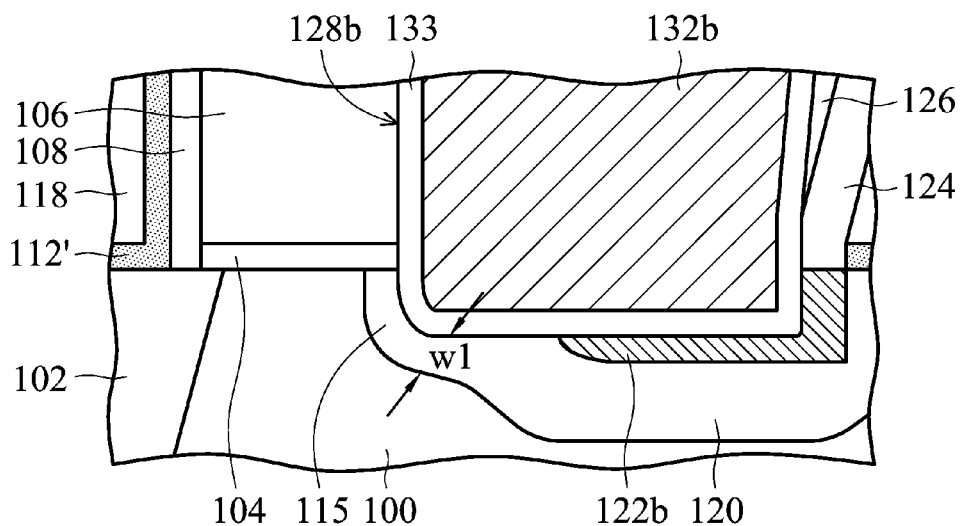
FIG. 4A is a cross sectional view showing a contact of a semiconductor device, in accordance with some embodiments.
Figure 4B:
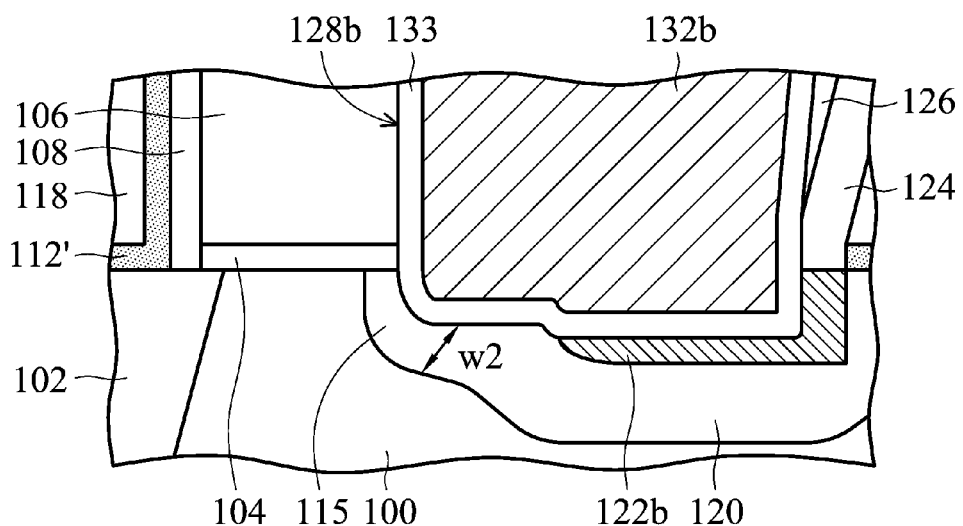
FIG. 4B is a cross sectional view showing a contact of a semiconductor device, in accordance with some embodiments.

Usually, the LDD region 115 is thin and could be damaged by over etching. Due to the existence of the doped protection layer 112', the LDD region 115 is not over etched during the etching process. Without the doped protection layer 112', the LDD region 115 may be over etched and lost such that a contact subsequently formed in the opening 128b would extend into the LDD region 115 too much to cause a current leakage problem and/or a short circuiting problem. In some cases, the contact subsequently formed in the opening 128b might even penetrate through the LDD region 115. FIG. 4A is a cross sectional view showing a contact structure of a semiconductor device in accordance with some embodiments, and no doped protection layer is used to protect the LDD region 115. During the etching process of the native oxide layer, the LDD region 115, which is not protected, is over etched. Thus, the formed contact 132b and a barrier layer 133 extend deep into the LDD region 115 to a location close to a region (such as a well region) in the semiconductor substrate 100. On the other hand, FIG. 4B is a cross sectional view showing a contact structure of a semiconductor device in accordance with some embodiments, and a doped protection layer is used to protect the LDD region 115. In this case, the LDD region 115, which is protected by the doped protection layer, is not over etched, and the contact 132b and the barrier layer 133 do not extend too deep to get too close to the well region in the semiconductor substrate 100. A distance w2 between the contact 132b and the border of the LDD region 115 in the structure shown in FIG. 4B is significantly larger than a distance w1 of that shown in FIG. 4A. In some embodiments, the distance w1 is in a range from about 2 Å to about 10 Å, and the distance w2, which is larger than the distance w1, is in a range from about 15 Å to about 25 Å. Therefore, a current leakage problem and/or a short circuiting problem may be reduced and/or prevented.

Figure 1I:
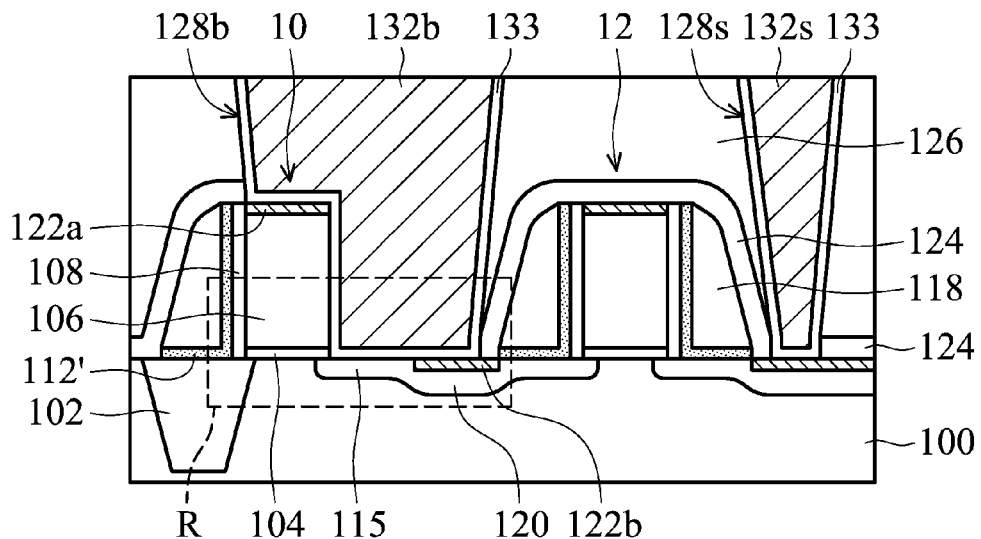

Referring to FIG. 1I, a conducting material is then filled into the openings 128b and 128s to form contacts 132b and 132s. The conductive material may be formed to fill the openings 128b and 128s by using a suitable process, such as a PVD process, CVD process, sputtering process, plating process, electroless plating process, the like, and/or combination process. A planarization process, such as a chemical mechanical polishing process or the like, may then be performed to remove the excess conducting material outside of the openings 128b and 128s to form the contacts 132b and 132s, respectively. The material of the contacts 132b and 132s includes tungsten, copper, aluminum, gold, platinum, nickel, titanium, other suitable materials, and/or combinations thereof. In some embodiments, the contact 132b is in direct contact with the gate electrode layer 106 of the gate stack 10. The sidewall of the gate electrode layer 106 is directly connected to the contact 132b. In addition, a diffusion barrier layer 133 may be optionally formed before the contact 132b is formed to prevent metal material of the subsequently formed contact 132b from diffusing into the insulating layer 126.

Referring to FIGS. 1I, 3A, and 3B, in some embodiments, the doped protection layer 112' (such as the doped protection layer 112' on the left side of the gate stack 10) has a portion 304 located on the sidewall of the gate stack 10 and a portion 302 sandwiched between the semiconductor substrate 100 and the bottom of the main spacer layer 118 (such as the main spacer layer 118 on the left side of the gate stack 10). The concentration of the doped quadrivalent element 306 in the portion 302 is higher than the concentration of the doped quadrivalent element 306 in the portion 304. The implanted quadrivalent elements 306 may be mainly located in a surface portion of the doped protection layer 112'. In some embodiments, a secondary ion mass spectrometer (SIMS) or other suitable tool is used to detect the existence, distribution, and/or the concentration of the implanted quadrivalent element.

Figure 5A:
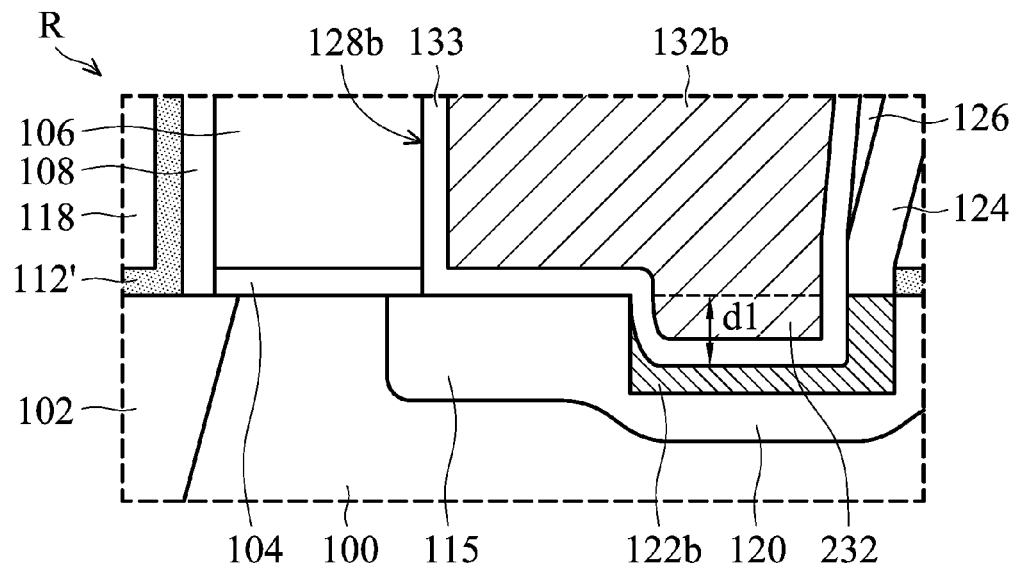
FIGS. 5A and 5B are cross sectional views each showing a contact of a semiconductor device, in accordance with some embodiments.
Figure 5B:
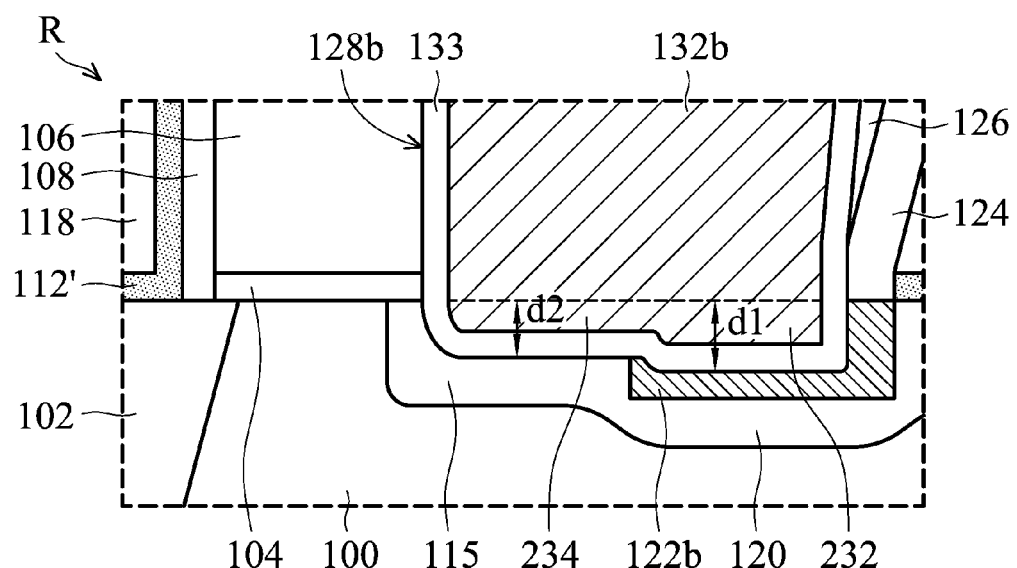

FIGS. 5A and 5B are cross sectional views each showing the contact 132b of the semiconductor device, in accordance with some embodiments, and like reference numerals are used to designate like elements. For example, FIG. 5A shows an enlarged cross sectional view of the region R in the structure shown in FIG. 1I. In some embodiments, after the etching process is performed to remove the native oxide layer 130 and the doped protection layer 112' on the LDD region 115, a portion of the metal silicide region 122b which is also a portion of the doped region 120 (such as an S/D region) is also removed such that the opening 128b further extends into the semiconductor substrate 100. In this case, the formed contact 132b may have a portion 232 extending into the doped region 120 or into the semiconductor substrate 100. For example, the portion 232 of the contact 132b extends into the metal silicide region 122b of the doped region 120 (such as an S/D region). The portion 232 of the contact 132b extends into the doped region 120 or into the semiconductor substrate 100 by a distance d1. The distance d1 may be in a range from about 5 Å to about 30 Å.

In some other embodiments, such as that shown in FIG. 5B, after the etching process is performed to remove the native oxide layer 130 and the doped protection layer 112' covering the LDD region 115, a portion of the LDD region 115 is also slightly removed such that the opening 128b has a second portion further extending into the semiconductor substrate 100. In this case, the formed contact 132b not only has a portion 232 extending into the doped region 120 but also a portion 234 extending into the LDD region 115. The portion 234 of the contact 132b extends into the semiconductor substrate 100 or the LDD region 115 by a distance d2 which is smaller than d1 and may be in a range from about 3 Å to about 20 Å. In other words, the portion 232 of the contact 132b extends deeper into the semiconductor substrate 100 than the portion 234 of the contact 132b. Because the doped protection layer 112' has a low etching rate to hinder the etching process, the contact 132b is prevented from being extended too much into the LDD region 115. Current leakage and/or short circuiting may thus be reduced and/or prevented.

Embodiments of mechanisms for forming the semiconductor device described above enable reducing over-etching of silicon substrate near the gate channel. By forming a doped protection layer to cover the surface of silicon substrate near the gate channel, the over-etching may be controlled and minimized. As a result, a contact subsequently formed is prevented from reaching too deeply into the silicon substrate to cause short circuiting and/or current leakage.

In accordance with some embodiments, a semiconductor device is provided. The semiconductor device includes a semiconductor substrate having a first doped region and a second doped region, and a gate stack formed on the semiconductor substrate. The semiconductor device also includes a main spacer layer formed on a sidewall of the gate stack. The semiconductor device further includes a protection layer formed between the main spacer layer and the semiconductor substrate. The protection layer is doped with a quadrivalent element. In addition, the semiconductor device includes an insulating layer formed over the semiconductor substrate and the gate stack, and a contact formed in the insulating layer. The contact has a first portion contacting the first doped region and has a second portion contacting the second doped region. The first portion extends deeper into the semiconductor substrate than the second portion.

In accordance with some embodiments, a semiconductor device is provided. The semiconductor device includes a semiconductor substrate having a source and drain (S/D) region and a lightly doped source and drain (LDD) region. The semiconductor device also includes a gate stack formed on the semiconductor substrate and an insulating layer formed on the semiconductor substrate and the gate stack. The semiconductor device further includes a contact formed in the insulating layer. The contact has a first portion contacting the S/D region and has a second portion contacting the LDD region. The first portion of the contact extends deeper into the semiconductor substrate than the second portion of the contact.

In accordance with some embodiments, a method for forming a semiconductor device is provided. The method includes providing a semiconductor substrate with a gate stack formed on the semiconductor substrate. The method also includes forming a protection layer doped with a quadrivalent element to cover a first doped region formed in the semiconductor substrate and adjacent to the gate stack. The method further includes forming a main spacer layer on a sidewall of the gate stack to cover the protection layer and forming an insulating layer over the protection layer. In addition, the method includes forming an opening in the insulating layer to expose a second doped region formed in the semiconductor substrate and forming one contact in the opening.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a semiconductor device, comprising:
   providing a semiconductor substrate with a gate stack formed thereon;
   forming a protection layer to cover a first doped region formed in the semiconductor substrate and adjacent to the gate stack;
   doping the protection layer with a quadrivalent element;
   forming a main spacer layer on a sidewall of the gate stack to cover the protection layer;
   forming an insulating layer over the protection layer;
   forming an opening in the insulating layer to expose a second doped region formed in the semiconductor substrate;
   partially removing the protection layer to expose the first doped region; and
   forming one contact in the opening.

2. The method for forming a semiconductor device as claimed in claim 1, wherein the protection layer is exposed after the opening is formed, a native oxide layer is grown over the second doped region after the second doped region is exposed, and the method further comprises removing the native oxide layer and the protection layer in the opening by an etching process before the contact is formed.

3. The method for forming a semiconductor device as claimed in claim 2, wherein the etching rate of the native oxide layer is higher than the etching rate of the protection layer in the etching process.

4. The method for forming a semiconductor device as claimed in claim 1, wherein the protection layer is doped with the quadrivalent element using an implantation process before the main spacer layer is formed.

5. The method for forming a semiconductor device as claimed in claim 4, wherein a main traveling direction of implanted ions during the implantation process is substantially perpendicular to a surface of the semiconductor substrate.

6. The method for forming a semiconductor device as claimed in claim 1, wherein the quadrivalent element comprises Si, Ge, C, or a combination thereof.

7. The method for forming a semiconductor device as claimed in claim 1, wherein the protection layer is exposed after the opening is formed, and the method further comprises completely removing the protection layer in the opening by an etching process before the contact is formed.

8. The method for forming a semiconductor device as claimed in claim 1, further comprising forming an etch stop layer over the gate stack, the main spacer layer, and the protection layer before the formation of the insulating layer.

9. The method for forming a semiconductor device as claimed in claim 8, wherein the formation of the opening comprises:
   partially removing the insulating layer to expose the etch stop layer; and
   partially removing the etch stop layer, the protection layer, and the main spacer layer to expose the second doped region and a portion of the protection layer on the first doped region.

10. The method for forming a semiconductor device as claimed in claim 9, further comprising completely removing the portion of the protection layer on the first doped region after the formation of the opening and before the formation of the contact.

11. A method for forming a semiconductor device, comprising:
   forming a gate stack over a semiconductor substrate;
   forming a first doped region in the semiconductor substrate;
   forming a protection layer over the gate stack and the first doped region;
   forming a main spacer element over a sidewall of the gate stack to cover a portion of the protection layer;
   forming a second doped region in the semiconductor substrate after the formation of the main spacer element;
   forming an insulating layer over the protection layer;
   forming an opening in the insulating layer to expose the second doped region formed in the semiconductor substrate, wherein the protection layer covers the first doped region during the formation of the opening;
   partially removing the protection layer to expose the first doped region; and
   forming a contact in the opening.

12. The method as claimed in claim 11, further comprising doping the protection layer with a quadrivalent element before the formation of the main spacer element.

13. The method as claimed in claim 12, wherein the quadrivalent element comprises Si, Ge, C, or a combination thereof.

14. The method as claimed in claim 11, further comprising:
   removing a portion of the protection layer not covered by the main spacer element before the formation of the insulating layer; and
   forming a silicide region over the second doped region after the partial removal of the protection layer and before the formation of the insulating layer.

15. The method as claimed in claim 11, further comprising forming an etch stop layer over the gate stack, the main spacer element, and the protection layer before the formation of the insulating layer.

16. The method for forming a semiconductor device as claimed in claim 15, wherein the formation of the opening comprises:
   partially removing the insulating layer to expose the etch stop layer; and
   partially removing the etch stop layer, the protection layer, and the main spacer element to expose the second doped region and a portion of the protection layer over the first doped region.

17. The method for forming a semiconductor device as claimed in claim 16, further comprising completely removing the portion of the protection layer over the first doped region after the formation of the opening and before the formation of the contact.

18. The method for forming a semiconductor device as claimed in claim 11, wherein the opening exposes a silicide region formed on the gate stack.

19. A method for forming a semiconductor device, comprising:
- forming a gate stack over a semiconductor substrate;
- forming a lightly doped source and drain (LDS/D) region in the semiconductor substrate;
- forming a protection layer over a sidewall of the gate stack and the LDS/D region;
- forming a main spacer element over the sidewall of the gate stack to cover a portion of the protection layer;
- forming a source and drain (S/D) region in the semiconductor substrate after the formation of the main spacer element;
- forming an insulating layer over the protection layer;
- forming an opening in the insulating layer to expose the S/D region, wherein the protection layer protects the LDS/D region during the formation of the opening;
- partially removing the protection layer to expose the LDS/D region; and
- forming a contact in the opening.

20. The method as claimed in claim 19, further comprising doping the protection layer with a quadrivalent element before the formation of the opening.

\* \* \* \* \*